United States Patent [19]

Plourde

[11] 4,214,645

[45] Jul. 29, 1980

[54] METHOD OF AND MEANS FOR LOUDSPEAKER SOUND WAVE DISTRIBUTION

[75] Inventor: Richard G. Plourde, Ashland, Mass.

[73] Assignee: Avid Corporation, East Providence, R.I.

[21] Appl. No.: 959,348

[22] Filed: Nov. 9, 1978

[51] Int. Cl.[2] ........................ G10K 11/00; H05K 5/00

[52] U.S. Cl. .................................... 181/148; 181/175; 181/199

[58] Field of Search ................................ 181/144–159, 181/175, 199; 179/1 E

[56] References Cited

U.S. PATENT DOCUMENTS

| | | | |
|---|---|---|---|
| 1,943,499 | 1/1934 | Williams | 181/159 |
| 2,162,270 | 6/1939 | Mott | 181/153 |
| 2,900,040 | 8/1959 | Novak | 181/152 |
| 3,047,090 | 7/1962 | Pruden | 181/152 |
| 3,135,349 | 6/1964 | Lahti | 181/151 |
| 3,356,179 | 12/1967 | Tomykins | 181/152 |
| 3,749,198 | 7/1973 | Everett et al. | 181/155 |
| 3,982,607 | 9/1976 | Evans | 181/152 |
| 4,031,337 | 6/1977 | Okamura et al. | 181/159 |

*Primary Examiner*—L. T. Hix

*Assistant Examiner*—Benjamin R. Fuller

*Attorney, Agent, or Firm*—William Frederick Werner

[57] ABSTRACT

A loudspeaker having a totally integrated acoustic system which reduces unwanted cabinet diffraction of the sound waves to minimum; resulting in maximum sound wave dispersion with directional accuracy.

6 Claims, 12 Drawing Figures

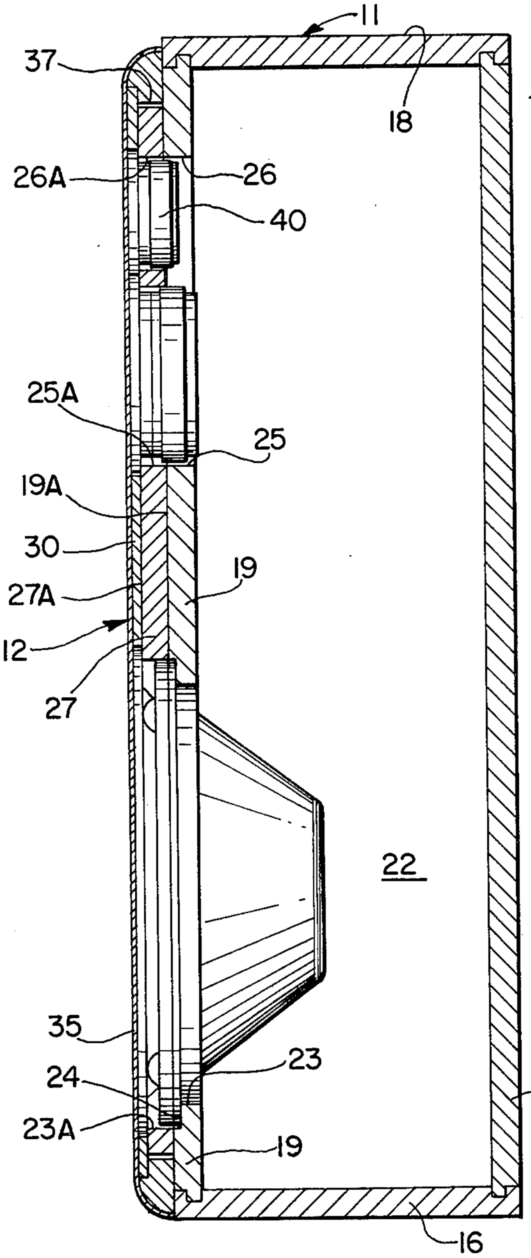
FIG. 4
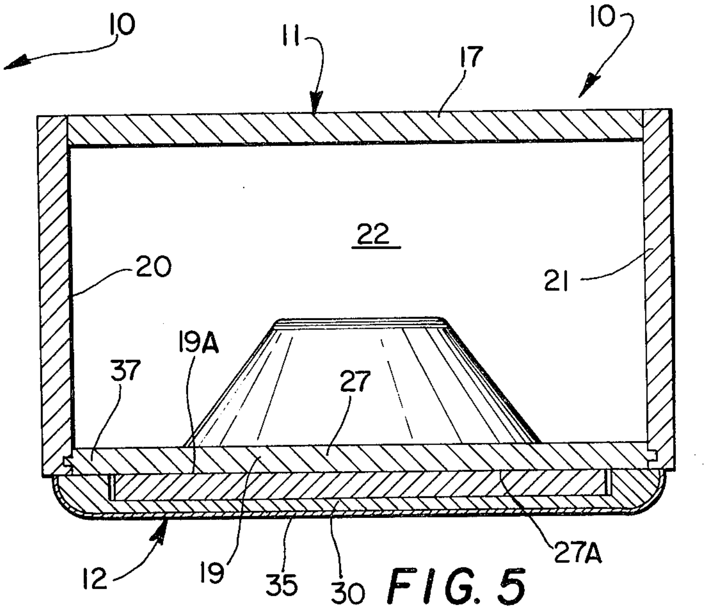
FIG. 5
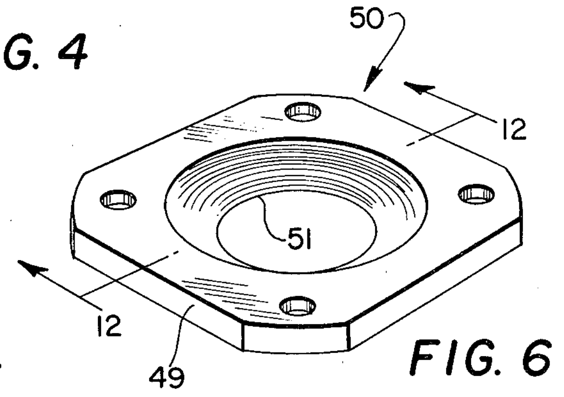
FIG. 6
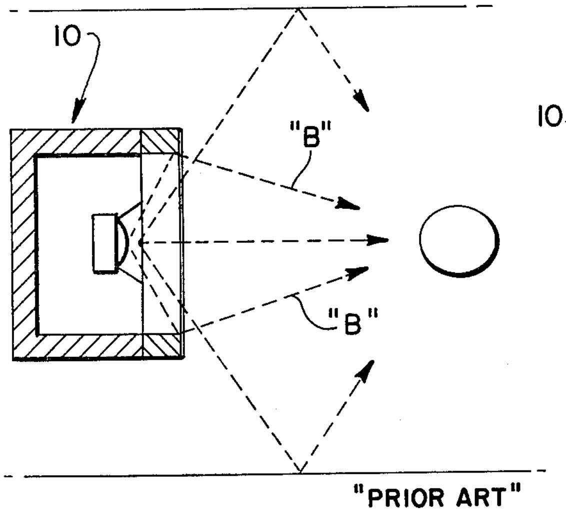
FIG. 7 "PRIOR ART"
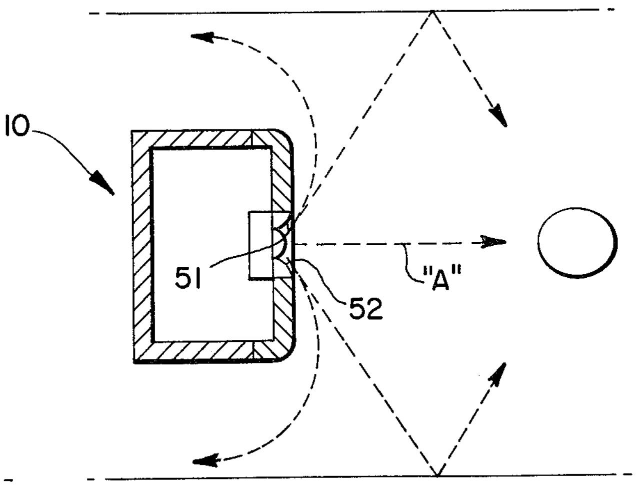
FIG. 8

METHOD OF AND MEANS FOR LOUDSPEAKER SOUND WAVE DISTRIBUTION

STATEMENT OF INVENTION

This invention relates to loudspeakers and more particularly to a construction wherein unwanted cabinet defraction of the sound waves and the resulting "boxy" sound quantity is reduced to a minimum.

PRIOR ART

Prior art loudspeakers have a common failing—their sound obviously comes from a box. To understand the problem it is necessary to grasp the way the brain interprets what it hears.

There are a number of distinct events which occur when a listener hears a musical instrument reproduced through a loudspeaker.

First, the ear hears the "first arrival" signal—the start of the note. This is used by the brain to identify the location of the sound source.

After the "first arrival" comes the early reflections (0.001 to 0.002 second delay) which are generated by reflections from the body of the musical instrument being used or from the edges of the speaker cabinet (called diffraction). The brain interprets these early reflections by comparing them to its prior experience to determine the probable size and shape of the sound source. In the case of a bookshelf loudspeaker, a box.

Next come the listening room reflections (0.005 to 0.020 seconds delay), from which the brain identifies the size and shape of the listening environment.

The purpose of high fidelity is to convince the brain of the listener that he is listening to a live performance. To accomplish this result, the unwanted early reflections, room reflections and other types of sound wave distortions which join the high fidelity sound waves, must be reduced to inaudible levels.

The present construction significantly reduces the unwanted early reflections associated with the loudspeaker which provides the brain with the clues about the box.

When a loudspeaker generates sound, the sound waves are radiated toward the listener and also along the face of the cabinet. When the sound wave reaches an obstruction or cabinet edge that drops away sharply, it is reflected, an effect called diffraction. The brain compares the character of these diffractions against prior experience to identify the sound source—a box.

The unwanted cabinet diffraction, and the resulting "boxy" sound, can be significantly reduced by the present construction of the combination of drivers, cabinet enclosure and grille, assembled to create a totally integrated acoustic system.

OBJECTS OF THE INVENTION

Accordingly, it is a principal object of the present invention to provide a construction which integrates the coupling devices or high frequency drivers with the cabinet;

Another object of the present invention is to reduce cabinet diffraction to a minimum in a box loudspeaker;

Still another object of the present invention is to provide coupling devices as integrated parts of each mid- and high-frequency driver;

A further object of the present invention is to provide a speaker enclosure device which improves the realistic quality of electronically reproduced sound.

Other objects of the present invention will become apparent in part and be pointed out in part in the following specification and claims.

BRIEF DESCRIPTION OF DRAWINGS

Referring to the drawings in which similar reference characters refer to the same parts:

FIG. 4 is a vertical cross-sectional view taken on line 4—4 of FIG. 1;

FIG. 5 is a horizontal cross-sectional view taken on line 5—5 of FIG. 1;

FIG. 6 is a perspective view of a coupling device;

FIG. 7 is a diagrammatic illustration of prior art cabinet diffraction;

FIG. 8 is a diagrammatic illustration of the new and improved integrated acoustic system.

Figure 1:
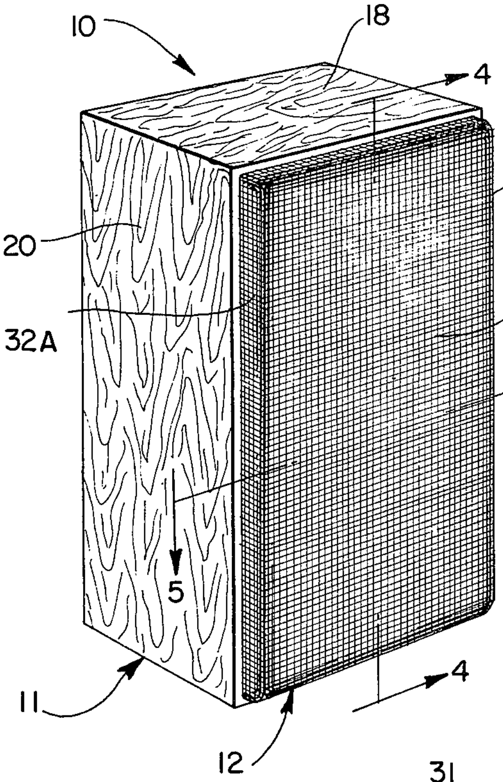
FIG. 1 is a perspective view of the new and improved loudspeaker.

The new and improved loudspeaker, generally designated by reference numberal 10, comprises a box or cabinet 11, a companion grill 12, a tweeter 13, a mid-range speaker 14 and a bass speaker 15.

The cabinet 11 consists of a bottom panel 16, a back panel 17, a top panel 18, a front panel 19, a left side panel 20 and a right side panel 21, fastened as by means of an adhesive to form a box having a chamber 22. Front panel 19 is provided with an orifice 23 and a recessed wall 24 around the periphery of orifice 23. Front panel 19 is also provided with two additional orifices 25 and 26. A face plate 27 is provided with three orifices 23A, 25A and 26A which are aligned with orifices 23, 25 and 26, respectively, with the face plate 27 fastened to front panel 19 by means of an adhesive.

Face plate 27 projects from front panel 19 to provide a four sided shelf 37.

The grille 12 comprises a wall 30 provided with three orifices 23B, 25B, 26B adapted to be aligned with orifices 23A, 25A and 26A, respectively. Wall 30 is framed with four molding strips 31, 32, 33 and 34. The outside edges of the molding strips are rounded 31A, 32A, 33A, 34A. The grille cloth 35 is fastened to wall 30, molding strips 31, 32, 33, 34 and edges 31A, 32A, 33A, 34A to provide an esthetic covering for grille 12.

Figure 3:
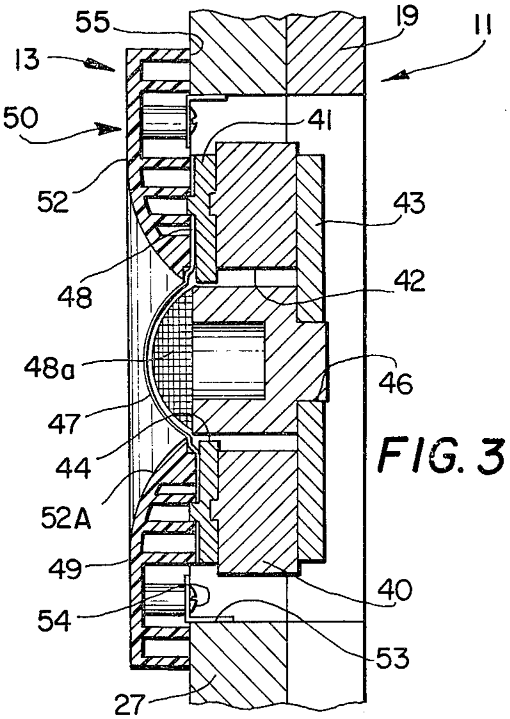
FIG. 3 is a vertical cross-sectional view, taken on line 3—3 of FIG. 2, showing the driver, coupling device and cabinet mounting of the tweeter.
Figure 12:
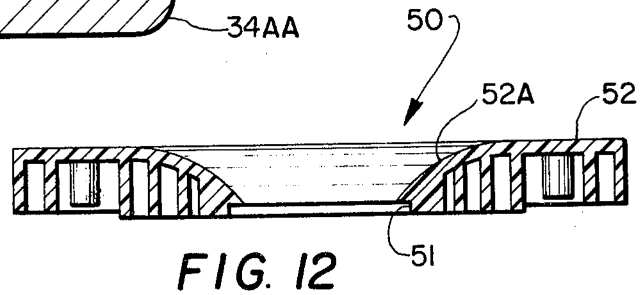
FIG. 12 is a horizontal cross sectional view, taken on line 12—12 of FIG. 6.

Reference is made to FIG. 3 wherein tweeter 13 is shown in vertical cross section. The tweeter comprises a magnet 40, having a central opening 42, and fastened between a top plate 41 and a back plate 43 as by means of an adhesive. Top plate 41 has an axial orifice 44. A pole piece 45 is located within central opening 42 and axial orifice 44 and is fastened to back plate 43 as at 46. A dynamic diaphragm 47 is provided with a flange 48. A voice coil 48A is positioned against pole piece 45 and within diaphragm 47. The flange 48 is positioned in a recess in top plate 41 and is fastened in position by a coupler or mounting plate 50. The voice coil 48A, diaphragm 47, pole piece 45 and magnet 40 are herein referred to as the driver. The mounting plate or coupler generally indicated by numeral 50, comprises a body 49 having an axial aperture 51 and a front face 52. Front face 52 is arcuately curved from said axial aperture 51 outwardly to provide an outer surface 52A which is curved over a portion thereof at **52*a* and terminates in a flat face 52, as shown in FIGS. 6 and 12. Mounting plate 50 is positioned against face plate 27 and is axially aligned with orifice 26A. A right angle bracket 53 is fastened to the wall forming orifice 26A and to mounting plate body 49, as by means of a plurality of screws 54 which has screws 49*b* passing therethrough and engaging top plate 41 to secure flange between the top plate 41 and mounting plate 50 as shown in FIG. 3. The back surface 55 of body 49 fastens flange 48 to top plate 41 in cooperation with screws 49*b* as previously explained. Voice coil 48A is secured to pole piece 45 by an adhesive. Similarly, back plate 43 is fixed to pole piece 45 by adhesive. Magnet 40 is fixed to back plate 43 by adhesive with top plate 41 being affixed by an adhesive to magnet 40. An adhesive is also used to cement top plate 41 to back surface 55, all as shown in FIG. 3**.

Mid-range speaker 14 and bass speaker 15 are similarly constructed and mounted to face plate 27. Speaker 14 is passed through orifices 25, 25A. Speaker 15 is paseed through orifices 23A, 23 and is positioned against recessed wall 24, projecting into chamber 22. It will be noted that the face front 19A of front panel 19 is in a smooth vertical plane and that face plate 27 also provides a smooth vertical front face 27A, with the four sides forming a shelf 37. The front face 27A of face plate 27 is interrupted by the outward projection of the sides 13A, 14A, 15A and mounting plates or coupler 50 of tweeter 13, mid-range speaker 14 and bass speaker 15, respectively.

Grille 12 is adapted to provide a smooth vertical and uninterrupted front surface 9, parallel to front panel 19, on cabinet 11. This is accomplished by placing orifices 23B, 25B, 26B over outwardly projecting sides 15A, 14A, 13A of couplers 50 which are a component of speakers 15, 14, 13, respectively. Molding strips 31, 32, 33, 34 will overlie and enbrace the four sided shelf 37 and abut face 19A of front panel 19. Wall 30 will abut front face 27A. FIG. 1 illustrates the cabinet according to the present invention.

In operation, when a loudspeaker generates sound, the sound waves are radiated toward the listener and also along the face of the cabinet. When the sound waves reach an obstruction or cabinet edge that drops away sharply, the waves are reflected, an effect called diffraction.

The mounting plate 50, or coupling device transmits the sound waves generated by the voice coil 47 or driver to and beyond the grille face 9 or cabinet 11 with minimum diffraction and maximum dispersion and sound wave accuracy toward the listener.

Grille 12 encloses each coupler of speaker 13, 14, 15 respectively to provide a smooth front to cabinet 11, thereby to significantly reduce unwanted diffraction effects or random sound waves bouncing off cabinet edges. The grille 12 is rounded off at the edges 31A, 32A 33A, 34A to create a smooth gradual transition from grille to cabinet sides, thereby reducing cabinet edge diffraction.

Figure 9:
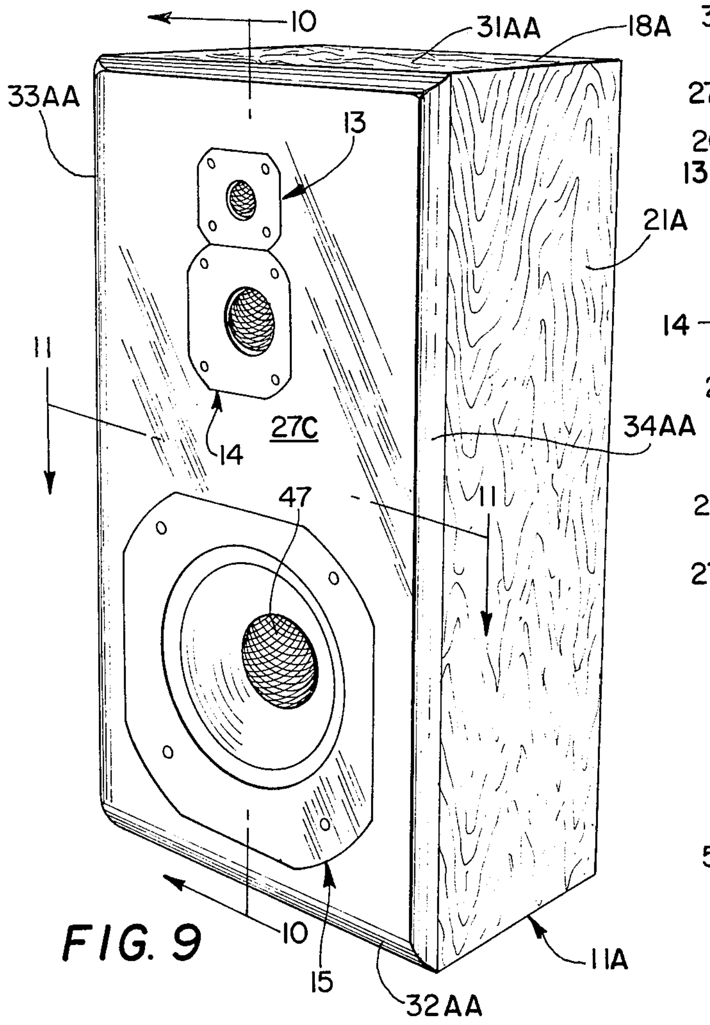
FIG. 9 is a perspective view of a modified construction of the new and improved loudspeaker.
Figure 10:
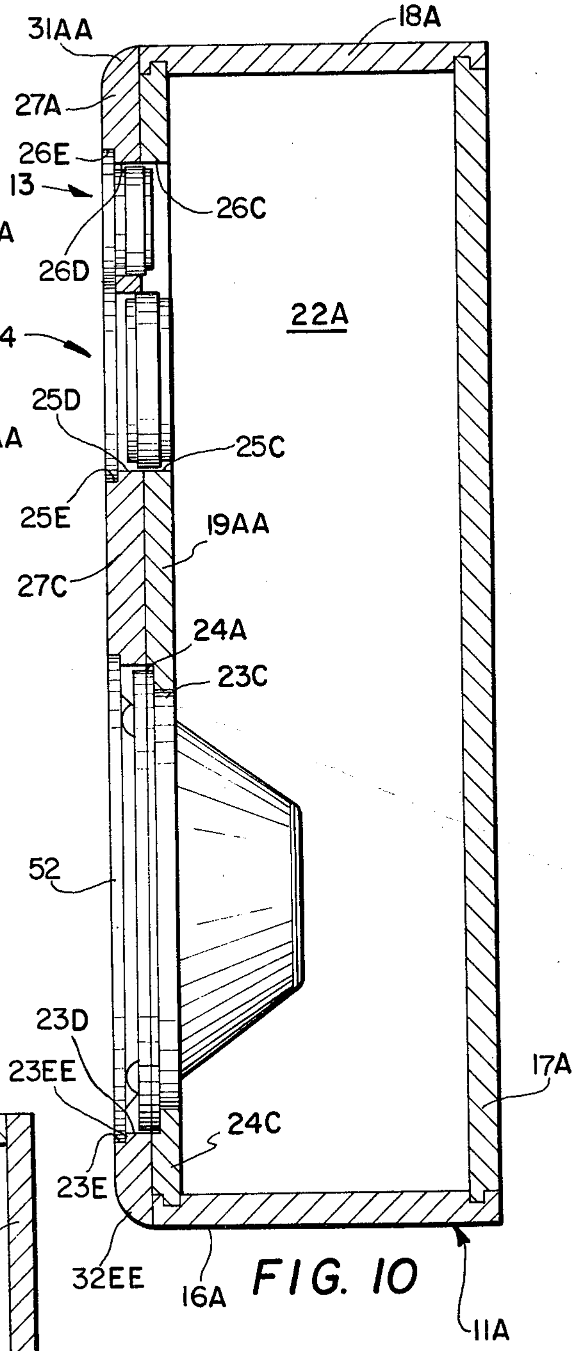
FIG. 10 is a vertical cross sectional view, taken on line 10—10 of FIG. 9.
Figure 11:
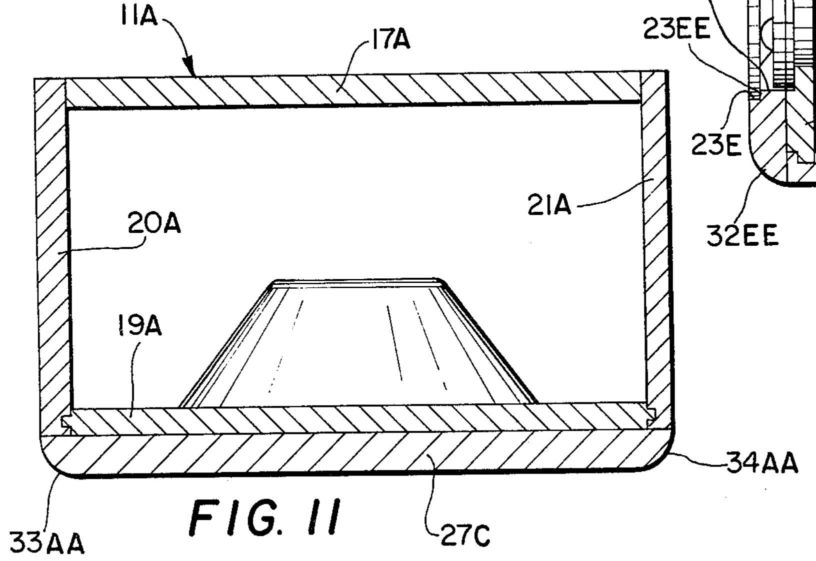
FIG. 11 is a horizontal cross sectional view, taken on line 11—11 of FIG. 9.

Attention is directed to FIGS. 9, 10, 11 and wherein is shown a modified form of cabinet construction. The cabinet 11A consists of a bottom panel 16A, a back panel 17A, a top panel 18A, a front panel 19AA, a left side panel 20A and a right side panel 21A, fastened together to form a box having a chamber 22A. Front panel 19AA is provided with an orifice 23C and a recessed wall 24C around the periphery of orifice 23C. Front panel 19A is also provided with two additional orifices 25C and 26C. A face plate 27C is provided with three orifices 23D, 25D and 26D, which are aligned with orifices 23C, 25C, 26C, respectively; with face plate 27C fastened to front panel 19AA. A recess 23E providing a shelf 23EE in face plate 27C is aligned with orifice 23D. Similarly, a recess 25E providing a shelf 25EE in face plate 27C is aligned with orifice 25D and a recess 26E providing a shelf 26 EE in face plate 27C is aligned with orifice 26D. The upper and lower edges 31AA and 32AA, respectively, are rounded. The side edge 33AA and 34AA are also rounded.

A mounting plate or coupler 50 containing tweeter 13 is positioned in orifice 26D with body 49 abutting the shelf in recess 26E. Front face 52 is aligned with the front face of face plate 27C and is flush or in the same vertical plane. Coupler 50 is fastened to face plate 27C.

Similarly, a mounting plate or coupler 50 containing midrange speaker 14 is positioned in orifice 25D with body 49 abutting the shelf in recess 25E. Face plate 52 is aligned and in the same vertical plane with the front face of face plate 27C. Coupler 50 is fastened to face plate 27C.

A mounting plate or coupler 50 containing bass speaker 15 is positioned in orifice 23D with body 49 abutting the shelf in recess 23E. Face plate 52 is aligned and in the same vertical plane with the front face of face plate 27C. Coupler 50 is fastened to face plate 27C.

It will be observed with reference to FIGS. 7 and 8 that sound waves generated by the driver pass from the axial aperture 51 and are reflected by arcuately curved front face 52 to direct the sound waves forwardly along the horizontal axis A of axial aperture 51 in FIG. 8. With a smooth surface on face plate 27C and with rounded edges 31AA, 32AA, 33A, 34A, the sound waves do not strike sharp edges which would distraught or cause cabinet diffraction of the sound waves as shown at "B" in FIG. 7.

Figure 2:
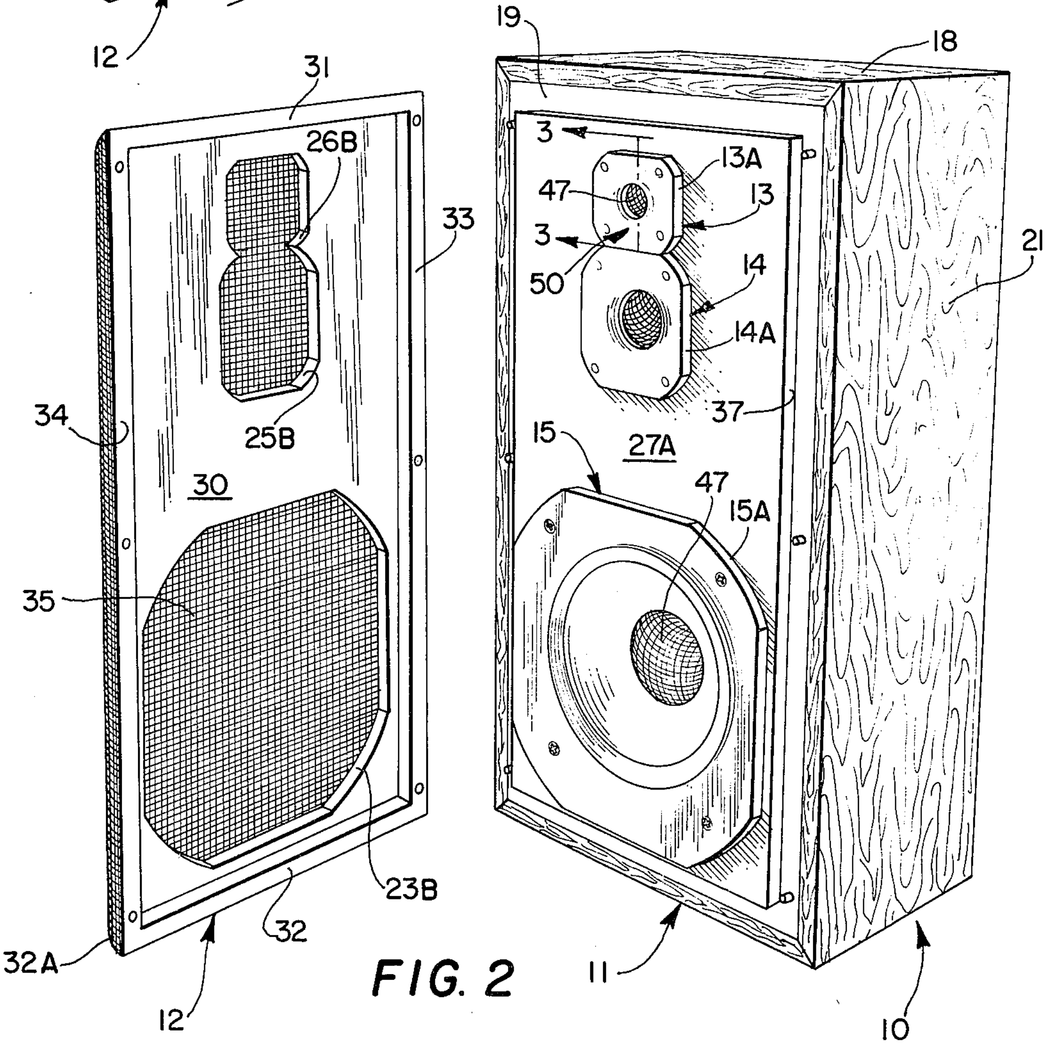
FIG. 2 is a view similar to FIG. 1, with the grille removed from the loudspeaker cabinet.

In FIGS. 1 and 2 the grille 12 provides a smooth vertical plane in grille cloth 35 parallel to face plate 27 with rounded edges 31A, 32A, 33A, 34A.

Having shown and described a preferred embodiment of the present invention by way of example, it should be realized that structural changes could be made and other examples given without departing from either the spirit or scope of this invention.

What I claim is:

1. A high frequency loudspeaker structure comprising a box having a front panel provided with an orifice, a face plate provided with an orifice, said face plate being secured to the face of said front panel with the orifices of said front panel and said face plate being in alignment, said face plate and said front panel each having a plurality of sides, said face plate having a smaller peripheral dimension than said front panel whereby when said face plate is secured to said front panel the sides of the face plate project forwardly from said front panel as raised edges, a forward wall having front and rear surfaces and being of a predetermined thickness and having an orifice therethrough, said forward wall having a plurality of sides equal in number to the sides of said face plate, the sides of said forward wall having strips projecting from the edges thereof whereby said strips engage with the edges of said face plate to connect said forward wall to said face plate, the orifice of said forward wall being aligned with said face plate orifice when said front wall strips are connected with said face plate edges; a speaker positioned in the opening defined by the orifices of said face plate, front panel and forward wall, said speaker having a mounting plate which includes a generally flat section over at least a portion thereof and having a central passage defined by a curved surface extending from said flat section, said mounting plate of said speaker extending forward of said face plate a distance substantially equal to the thickness of said forward wall, whereby when said forward wall is connected with said face plate the flat section of said mounting plate lays in the same plane as the front surface of said forward wall with said flat section of said mounting plate and said front surface of said forward wall providing a generally continuous and uninterupted surface.

2. Apparatus as set forth in claim 1 wherein the surfaces of said strips remote from the strip surfaces engageable with said edges are rounded.

3. Apparatus as set forth in claim 2 including a thin grille covering said forward wall and the flat section of said mounting plate.

4. Apparatus as set forth in claim 2 wherein said speaker resides entirely within the plane of said face plate, front panel and forward wall.

5. Apparatus as set forth in claim 2 including means securing said speaker to said face plate.

6. Apparatus as set forth in claim 2 wherein the orifices through said face plate, front panel and forward wall comprise an orifice set, there being a plurality of sets of orifices in said speaker structure, each said set of orifices being provided with a speaker having a mounting plate which includes a generally flat section, and all of flat sections laying in the same plane.

* * * * *